United States Patent
Kang (10) Patent No.: US 8,212,293 B2
(45) Date of Patent: Jul. 3, 2012

(54) TRANSISTOR OF SEMICONDUCTOR DEVICE AND METHOD FOR FABRICATING THE SAME

(75) Inventor: Chun Soo Kang, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 361 days.

(21) Appl. No.: 11/958,723

(22) Filed: Dec. 18, 2007

(65) Prior Publication Data
US 2009/0001482 A1    Jan. 1, 2009

(30) Foreign Application Priority Data

Jun. 28, 2007  (KR) .................. 10-2007-0064745

(51) Int. Cl.
*H01L 27/118* (2006.01)
(52) U.S. Cl. .................. 257/202; 257/E27.108
(58) Field of Classification Search .................. 257/202, 257/210, 211, 296, 374, 510, E27.108, E27.109, 257/E21.65, E27.06
See application file for complete search history.

(56) References Cited

U.S. PATENT DOCUMENTS

| | | | | |
|---|---|---|---|---|
| 2005/0077568 A1* | 4/2005 | Park et al. | | 257/330 |
| 2005/0250270 A1 | 11/2005 | Wu et al. | | |
| 2006/0237776 A1* | 10/2006 | Forbes et al. | | 257/315 |
| 2007/0001213 A1* | 1/2007 | Om et al. | | 257/315 |
| 2007/0018205 A1* | 1/2007 | Chidambarrao et al. | | 257/288 |
| 2007/0170522 A1* | 7/2007 | Lee et al. | | 257/401 |
| 2007/0218612 A1 | 9/2007 | Lin et al. | | |
| 2008/0012055 A1* | 1/2008 | Kim et al. | | 257/296 |

FOREIGN PATENT DOCUMENTS

| | | |
|---|---|---|
| JP | 09-246402 | 9/1997 |
| KR | 10-2004-0013460 | 2/2004 |

* cited by examiner

*Primary Examiner* — Ha Tran T Nguyen
*Assistant Examiner* — Vongsavanh Sengdara
(74) *Attorney, Agent, or Firm* — Marshall, Gerstein & Borun LLP (57) ABSTRACT

Provided is a transistor of a semiconductor device and a method for fabricating the same. A transistor of a semiconductor device may include: a semiconductor substrate having an active region defined by an isolation layer; a recess trench formed in the active region and disposed to cross the semiconductor substrate in one direction; and a gate line formed in a straight line pattern, overlapping the recess trench and disposed to cross the recess trench at approximately right angles.

8 Claims, 14 Drawing Sheets

TRANSISTOR OF SEMICONDUCTOR DEVICE AND METHOD FOR FABRICATING THE SAME

CROSS-REFERENCE TO RELATED APPLICATION

The priority of Korean patent application number 10-2007-0064745, filed on Jun. 28, 2007, which is incorporated by reference in its entirety, is claimed.

FIELD OF INVENTION

The invention relates to a semiconductor device, and more particularly, to a transistor of a semiconductor device and a method for fabricating the same.

BACKGROUND OF THE INVENTION

A semiconductor memory device, for example, a dynamic random access memory (DRAM) device generally includes: a memory cell array region, a core region, and a peripheral circuit region. The core region includes: a sub-word line driver, a sense amplifier, and a YI transistor. The YI transistor connects a bit line with a segment input/output (I/O) line. Generally, the YI transistor has a wave pattern instead of a straight pattern in order to reduce the size of the core region while ensuring the proper width thereof.

Figure 1:
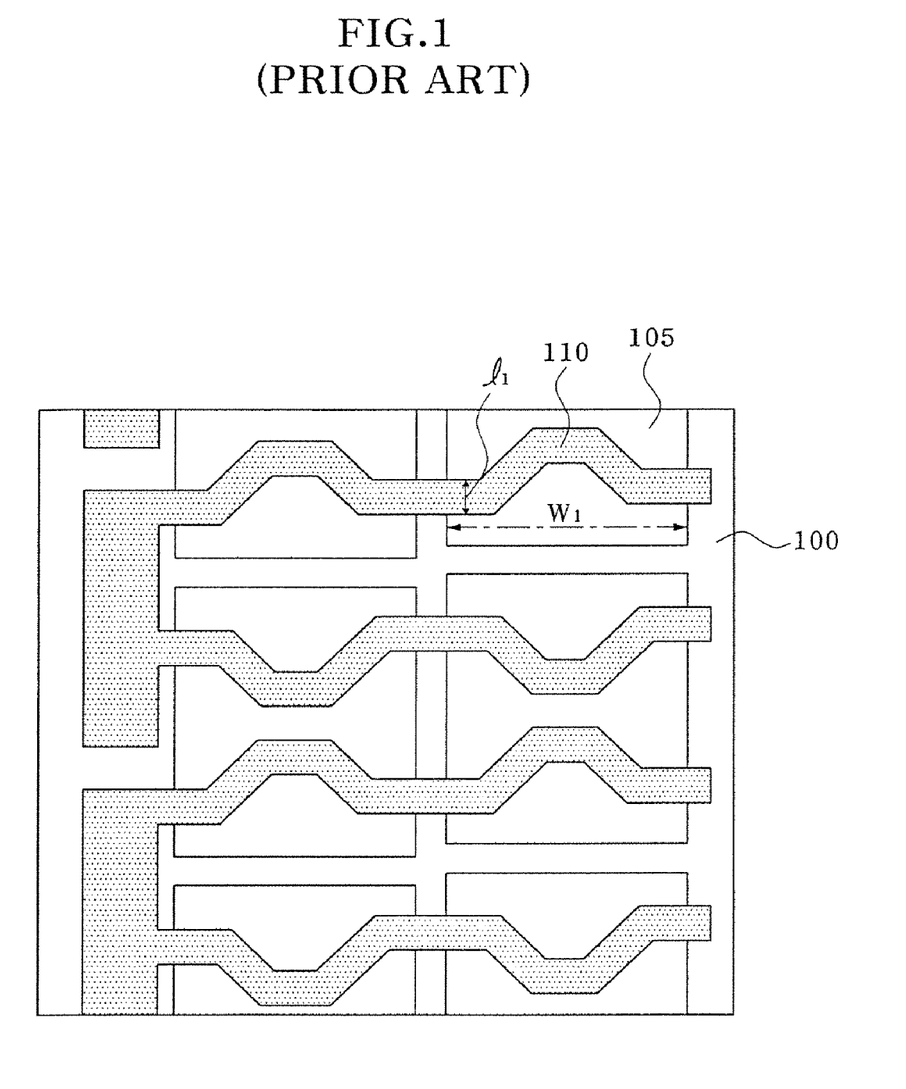
FIG. 1 illustrates a conventional YI transistor.

FIG. 1 illustrates a conventional YI transistor.

Referring to FIG. 1, the YI transistor 110 is disposed to cross an active region 105 of a semiconductor substrate 100. In order to ensure an effective channel length while preventing an increase of a chip size, the YI transistor 110 on the active region 105 has a wave pattern that increases the width W1 of the YI transistor 110. As a result, an area occupied by the YI transistor 110 decreases, thereby reducing the size of the core region.

However, when a YI transistor is formed in the wave pattern, there is a difference between the target wave pattern and the final resulting wave pattern in terms of the length of the YI transistor. The length difference may be more than 30 nanometers (nm).

Such the large length difference may affect the characteristics of a semiconductor memory device. More particularly, the large length difference degrades critical dimension uniformity of the wave pattern. In addition, an optical proximity correction (OPC) process is not useful for correcting pattern distortion because of the length difference.

SUMMARY OF THE INVENTION

Various embodiments of the present invention relate to a transistor of a semiconductor device that may include: a semiconductor substrate including an active region defined by an isolation layer, a recess trench formed in the active region and disposed to cross the semiconductor substrate in one direction, and a gate line formed in a substantially straight line pattern, overlapping the recess trench and disposed to cross the recess trench at approximately right angles.

In one embodiment of the present invention, the isolation layer may include a dummy pattern disposed over the isolation layer between adjacent gate lines. The dummy pattern may be formed of a material similar to that of the gate line. The recess trench may be disposed within the active region.

In one embodiment of the present invention, the recess trench may be formed in a rectangular type in which a length in the Y-axis direction is greater than that in the X-axis direction. The recess trench may be spaced from an adjacent recess trench by a predetermined distance.

In one embodiment of the present invention, the transistor may be selected from the group consisting of a latch transistor, a sub word line drive PMOS transistor, a main word line drive transistor, a Y-decoder transistor, and a YI transistor.

Various embodiments of the present invention relate to a method for fabricating a transistor of a semiconductor device that may include: forming an isolation layer to define an active region in a semiconductor substrate, forming a recess trench in the active region by etching the semiconductor substrate to a predetermined depth, and forming a gate line in a substantially straight line pattern, overlapping the recess trench and disposed to cross the recess trench at approximately right angles.

In one embodiment of the present invention, the forming of the recess trench may include, forming a photoresist layer pattern having an opening that exposes a portion of the active region and etching the exposed portion using the photoresist layer pattern as a mask. The opening may be a rectangular type in which a length in the Y-axis direction is greater than that in the X-axis direction.

In another embodiment of the present invention, the opening may be formed within the active region.

In one embodiment of the present invention, the opening may be formed in an island type.

In one embodiment of the present invention, the forming of the gate line may include: forming stacked layers for the gate line over the semiconductor substrate including the recess trench; forming a photoresist layer pattern over the stacked layers and disposed to cross the recess trench at approximately right angles in a substantially straight line pattern, a portion of the stacked layers being blocked by the photoresist layer pattern; and forming the gate line by etching the stacked layers using the photoresist layer pattern as a mask.

In one embodiment of the present invention, the method may further include forming a dummy pattern over the isolation layer while forming the gate line.

In one embodiment of the present invention, the transistor may be selected from the group consisting of a latch transistor, a sub word line drive PMOS transistor, a main word line drive transistor, a Y-decoder transistor, and a YI transistor.

BRIEF DESCRIPTION OF THE DRAWINGS

FIG. 5A to 9C illustrate a method for fabricating a transistor of a semiconductor device according to one embodiment of the present invention.

DESCRIPTION OF SPECIFIC EMBODIMENTS

The transistor and the manufacturing method thereof reduces the size of a core region while ensuring the desired width of a transistor, thereby decreasing line width change and ensuring critical dimension uniformity of a pattern for the transistor.

Figure 2:
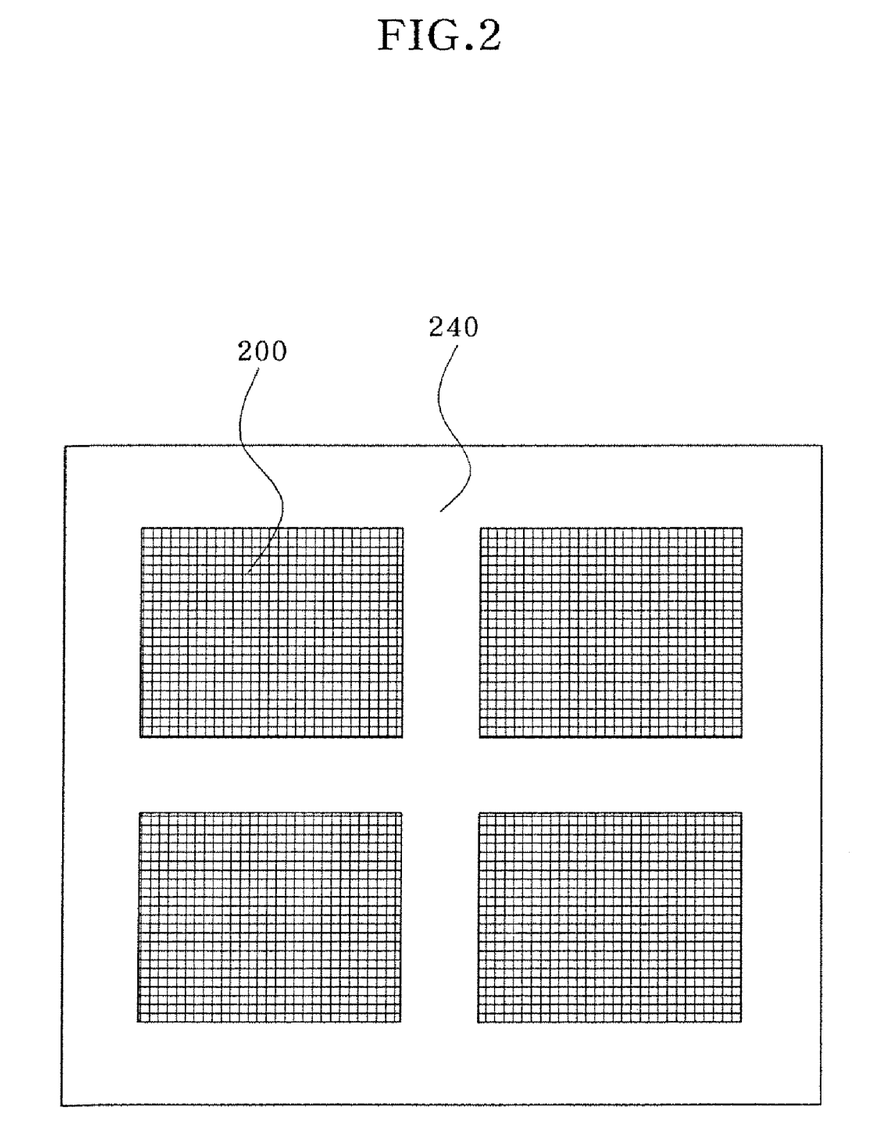
FIG. 2 illustrates a schematic diagram of a semiconductor memory device.
Figure 3:
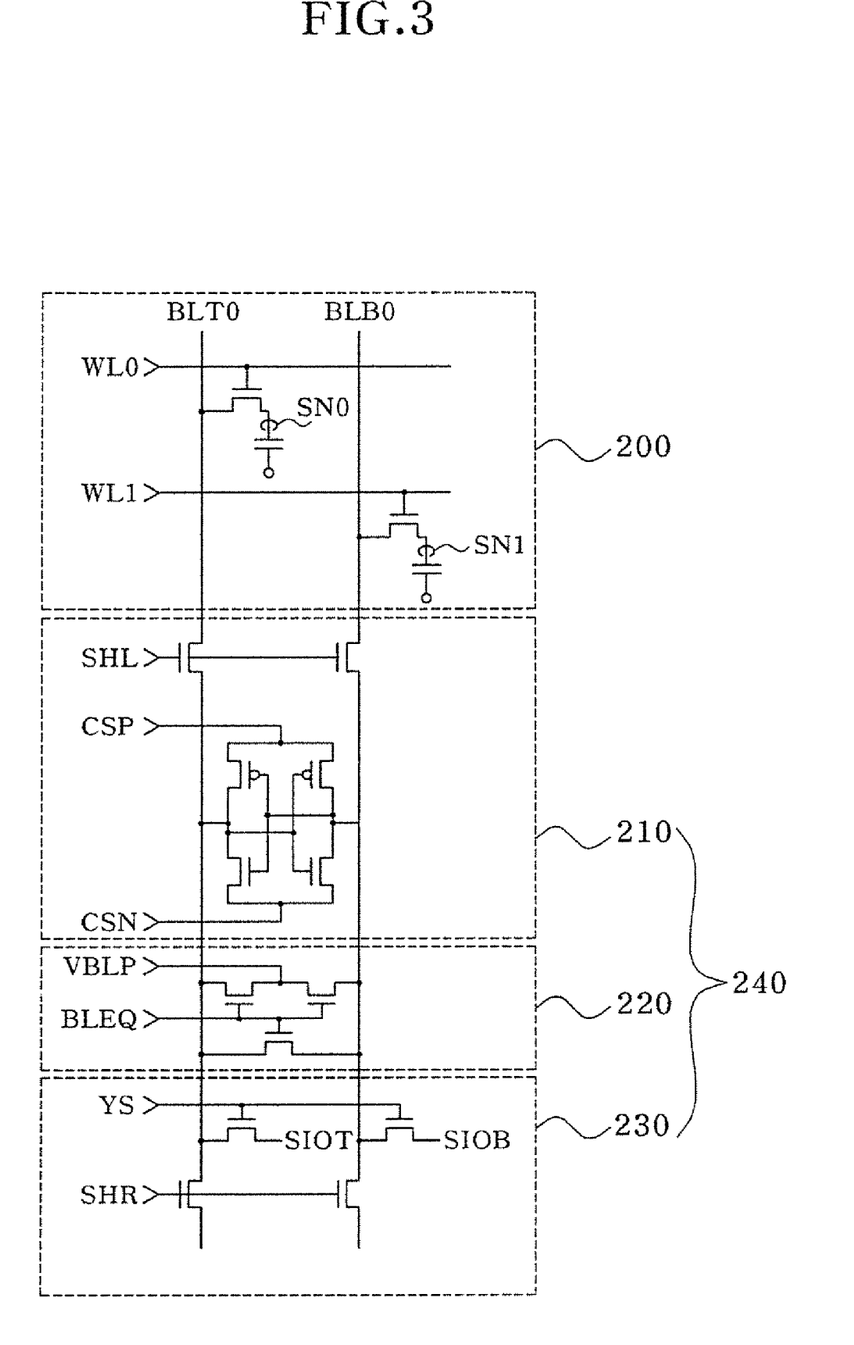
FIG. 3 illustrates a circuit diagram of operating circuits in a cell array region and a core region of a semiconductor memory device.

FIG. 2 illustrates a schematic diagram of a semiconductor memory device, and FIG. 3 illustrates a circuit diagram of operating circuits in a cell array region and a core region.

Referring to FIG. 2, a semiconductor memory device may be divided into three regions such as a memory cell array region 200, a core region 240, and a peripheral circuit region (not shown). The memory cell array region 200 may include, for example, word lines, bit lines, and memory cells arranged at positions where the word lines intersect with the bit lines. A desired memory cell may be accessed by selecting a corresponding word line and bit line. The core region 240 and the peripheral circuit region are located on the periphery of the memory cell array region 200 and may include circuits for driving and controlling the memory cells.

Referring to FIG. 3, the memory cell array region 200 may include word lines WL0 and WL1, bit lines BLT0 and BLB0, and capacitors SN0 and SN1. The core region 240 may include a sub word line driver, a sense amplifier 210, an equalizer circuit 220, and a transistor 230. The peripheral circuit region may include a data/address input/output unit and wiring lines.

The transistor 230 may be used as a connecting transistor that connects, for example, a bit line and a segment input/output line, and is disposed in the core region 240 to select a column for operation of a semiconductor device. In a conventional method, in order to increase the width of the transistor 230 and ensure a desired effective channel length while preventing an increase in chip size, the transistor 230 has a wave pattern. However, when the transistor 230 is formed in the wave pattern, the critical dimension uniformity of the wave pattern is deteriorated due to change in the length of the transistor 230. Moreover, executing an optical proximity correction (OPC) process on the transistor 230 may not be useful because the transistor 230 is formed in a wave shape. Accordingly, in one embodiment of the present invention, a transistor is provided to increase effective channel length while reducing core region size.

Figure 4:
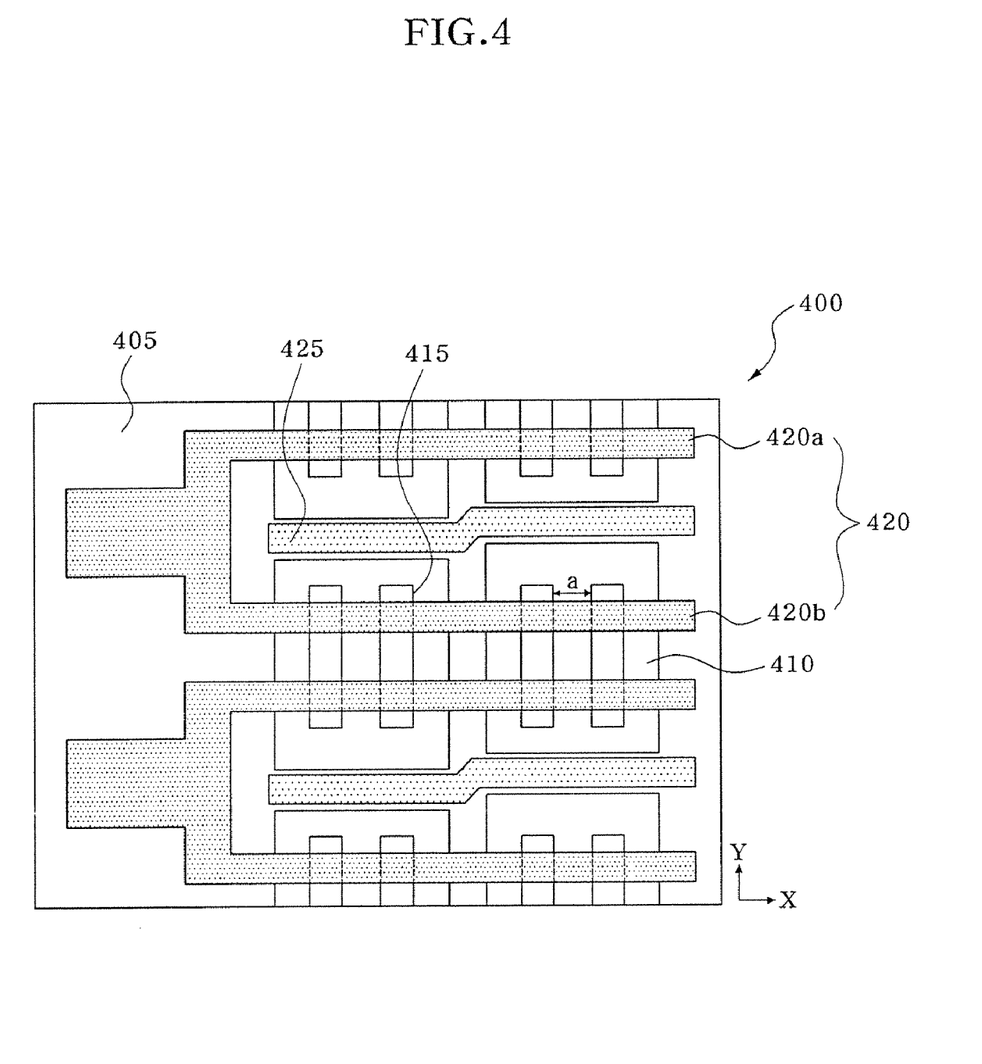
FIG. 4 illustrates a diagram of a transistor according to one embodiment of the present invention.

FIG. 4 illustrates a diagram of a transistor according to one embodiment of the present invention.

Referring to FIG. 4, the transistor in a core region may include a semiconductor substrate 400, recess trenches 415, and gate lines 420. The semiconductor substrate 400 may include an active region 410 defined by an isolation layer 405. The recess trench 415 may be formed in the active region 410 to a predetermined depth and disposed to cross the semiconductor substrate 400 in one direction. The gate line 420 overlaps the recess trench 415, and may be formed in a substantially straight line pattern and disposed to cross the recess trench 415 at approximately right angles.

The recess trench 415 may be formed within the active region 410 and may be formed in a rectangular type in which a length in the Y-axis direction is greater than that in the X-axis direction. A space, a, is defined between adjacent recess trenches 415. The number and size of the spaces are determined in consideration of the profile and width of the entire transistor. A dummy pattern 425 may be disposed on the isolation layer 405 between the gate line 420a and the gate line 420b. The dummy pattern 425 serves to improve the uniformity of the transistor. The effective channel of the transistor made by the above described method is positioned along the recess trench 415 formed in the active region 410. The effective channel length of the transistor increases proportionally to the depth of the recess trench 415. Therefore, the width of the transistor can be shortened by approximately the increased effective channel length, so that the entire size of the core region can be reduced.

Due to the formation of the recess trench 415, by etching the active region 410 partially, the entire size of the core region may be reduced while the desired width of the transistor is ensured. Thus, the size of a chip may be reduced.

The above method for ensuring the desired width of the transistor by forming the recess trench 415 in the active region 410 can be used to form, for example, a YI transistor, a latch transistor, a sub word line drive PMOS transistor, a main word line drive transistor, and a Y decoder transistor.

Figure 10:
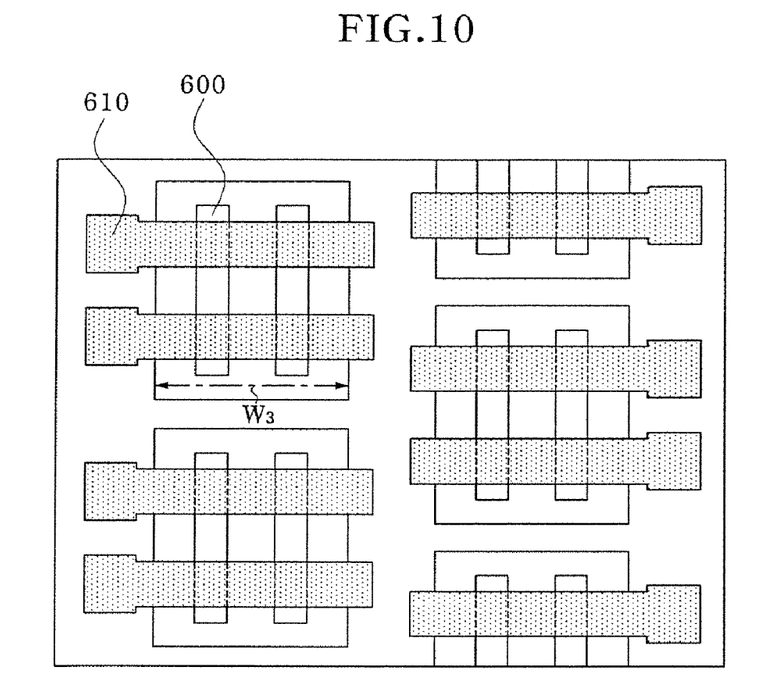
FIGS. 10 and 11 illustrates a transistor formed using a recess trench according to one embodiment of the present invention.
Figure 11:
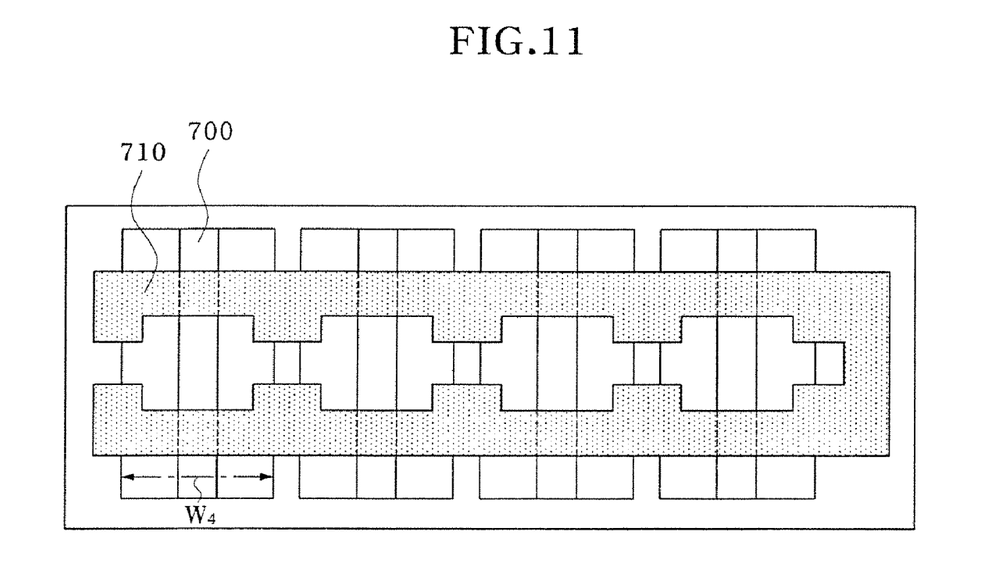

FIG. 5A to 9C illustrate a method for fabricating a transistor of a semiconductor device according to one embodiment of the present invention. FIGS. 10 and 11 illustrate a transistor formed using a recess trench according to one embodiment of the present invention.

Figure 5A:
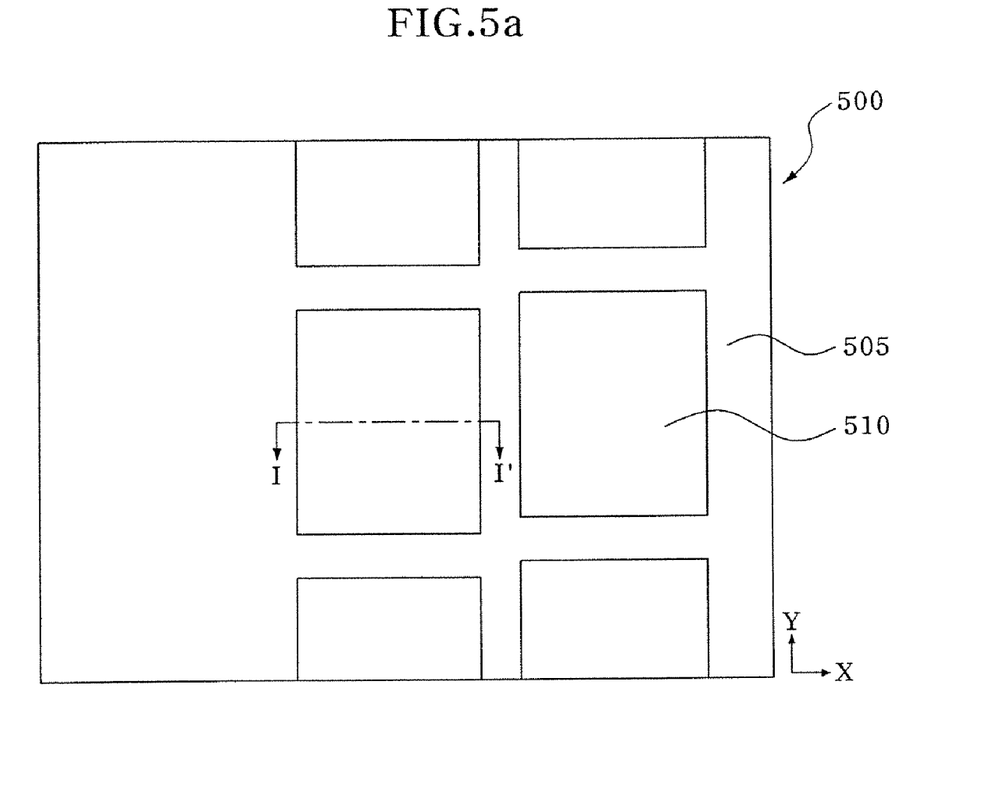
Figure 5B:
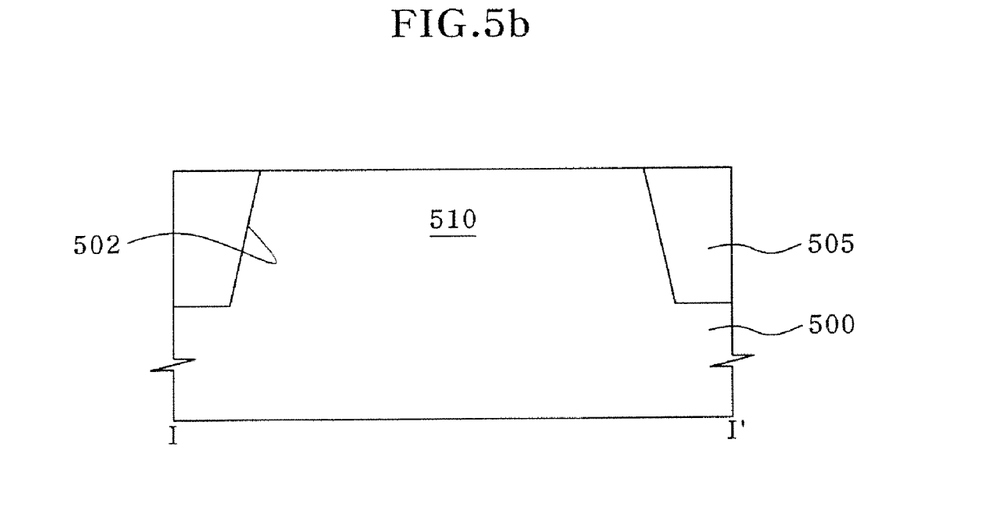

Referring to FIGS. 5A and 5B, an active region 510 is defined by forming an isolation layer 505 in a core region of a semiconductor substrate 500. The active region 510 is formed to be spaced apart from adjacent active regions 510 by a predetermined distance.

Referring to FIG. 5B, showing a cross-sectional view taken along line I-I' of FIG. 5A, a trench 502 is formed in a semiconductor substrate 500 and then is filled with an insulation layer. The insulation layer in the trench 502 is removed by performing, for example, a chemical mechanical polishing (CMP) process, such as a planarization process. Accordingly, the isolation layer 505 defining the active region 510 of the semiconductor substrate 500 is formed. The insulation layer may be formed of high density plasma (HDP) oxide.

Figure 6A:
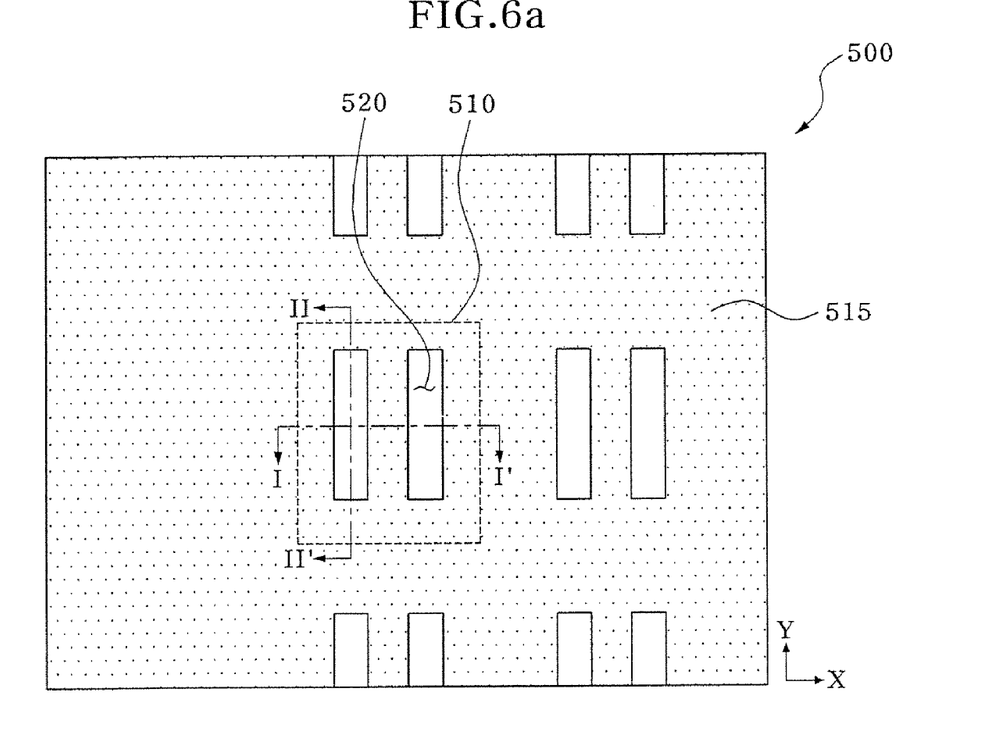
Figure 6B:
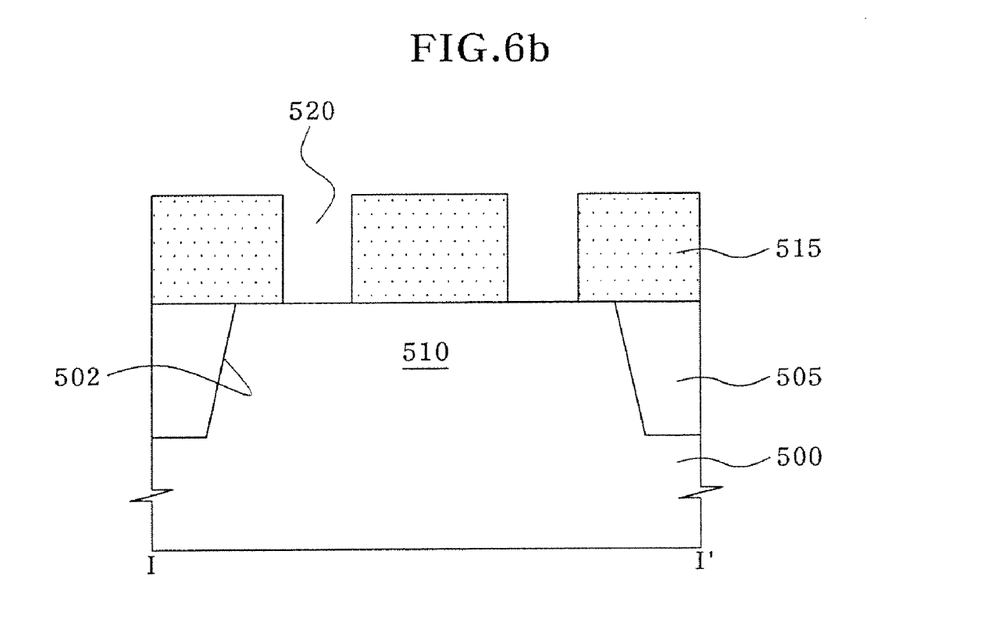
Figure 6C:
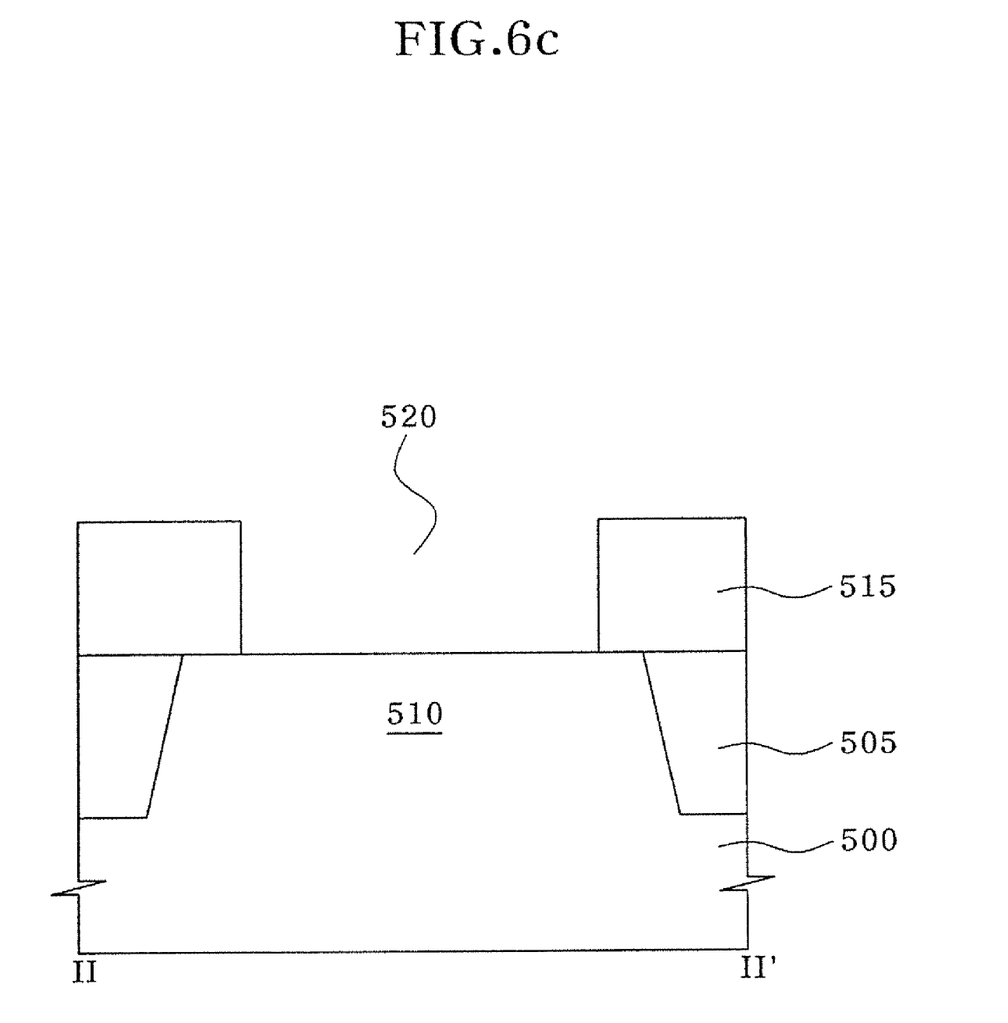

Referring to FIG. 6A to 6C, a photoresist layer is coated on the semiconductor substrate 500. The photoresist layer is then patterned to form a photoresist layer pattern 515 having an opening 520 defining a region in which a recess trench is to be formed. FIGS. 6B and 6C illustrate cross-sectional views taken along lines I-I' and II-II' of FIG. 6A. Descriptions of FIGS. 6B and 6C are omitted.

The photoresist layer is formed on the semiconductor substrate 500. The photoresist layer may be coated using a spin coating method. A photolithography process, which includes a light exposing process and a developing process, may be performed on the photoresist layer using a light exposure apparatus and a photomask. The photoresist layer is exposed to light transmitted through the photomask from the light exposure apparatus. Light receiving portions of the photoresist layer are removed by a developing solution. As a result, the photoresist layer pattern 515 is formed with an opening 520 that exposes a portion of the surface of the active region 510 in the semiconductor substrate 500. The recess trench may be formed in a region of the semiconductor substrate 500 exposed by the opening 520 of the photoresist layer pattern 515. The opening 520 may be formed in a rectangular type, in which a length in the Y-axis direction is greater than that in the X-axis direction. The opening 520 may be formed in an island type so as not to exceed the active region 510.

Figure 7A:
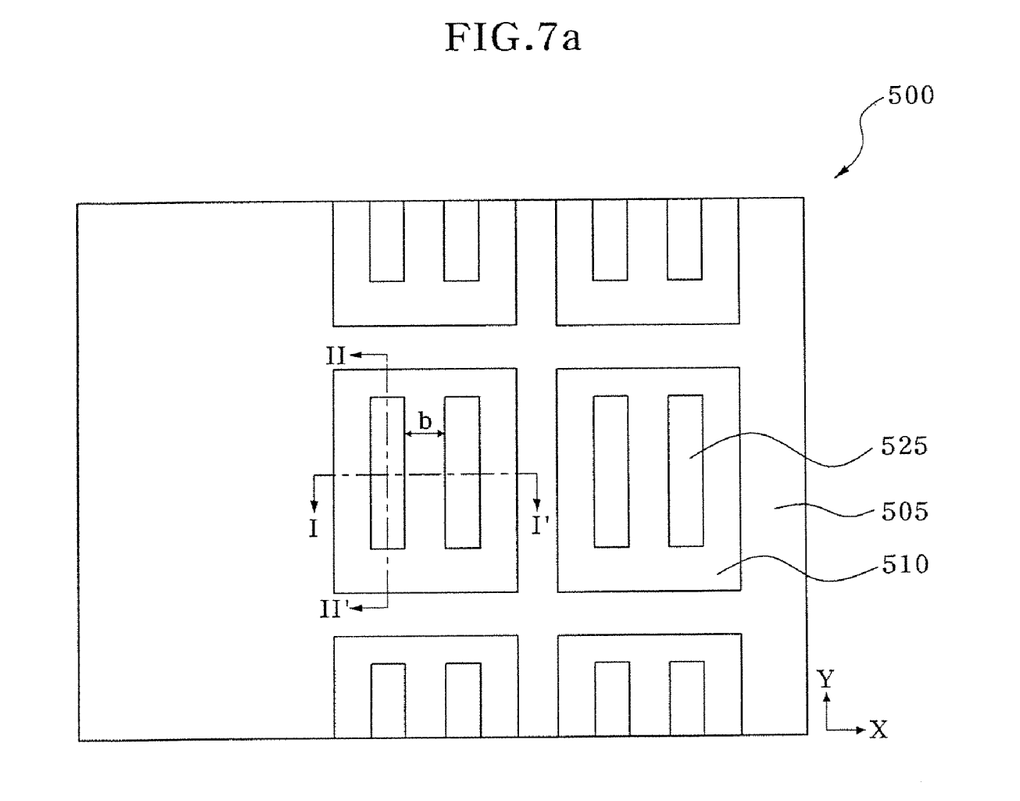
Figure 7B:
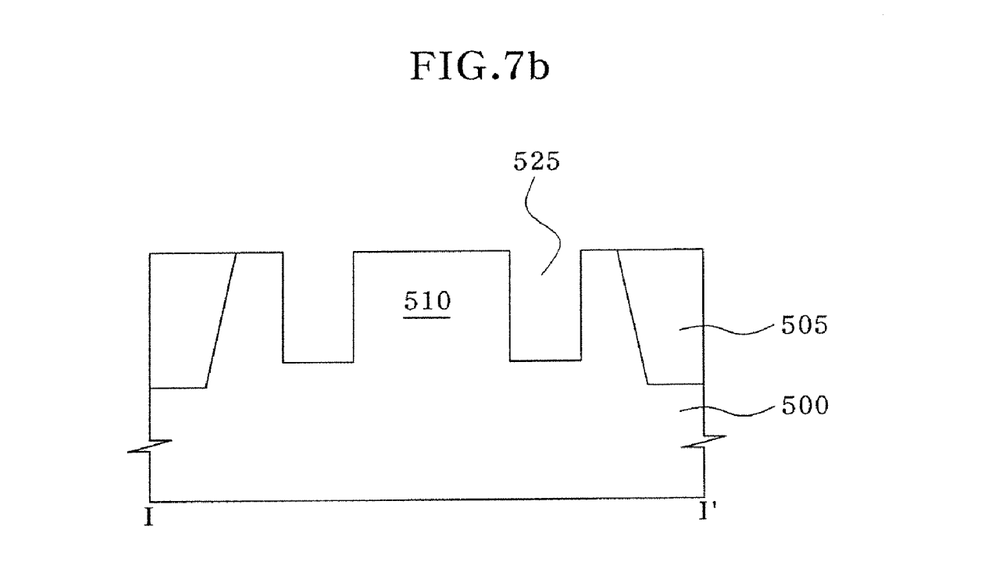
Figure 7C:
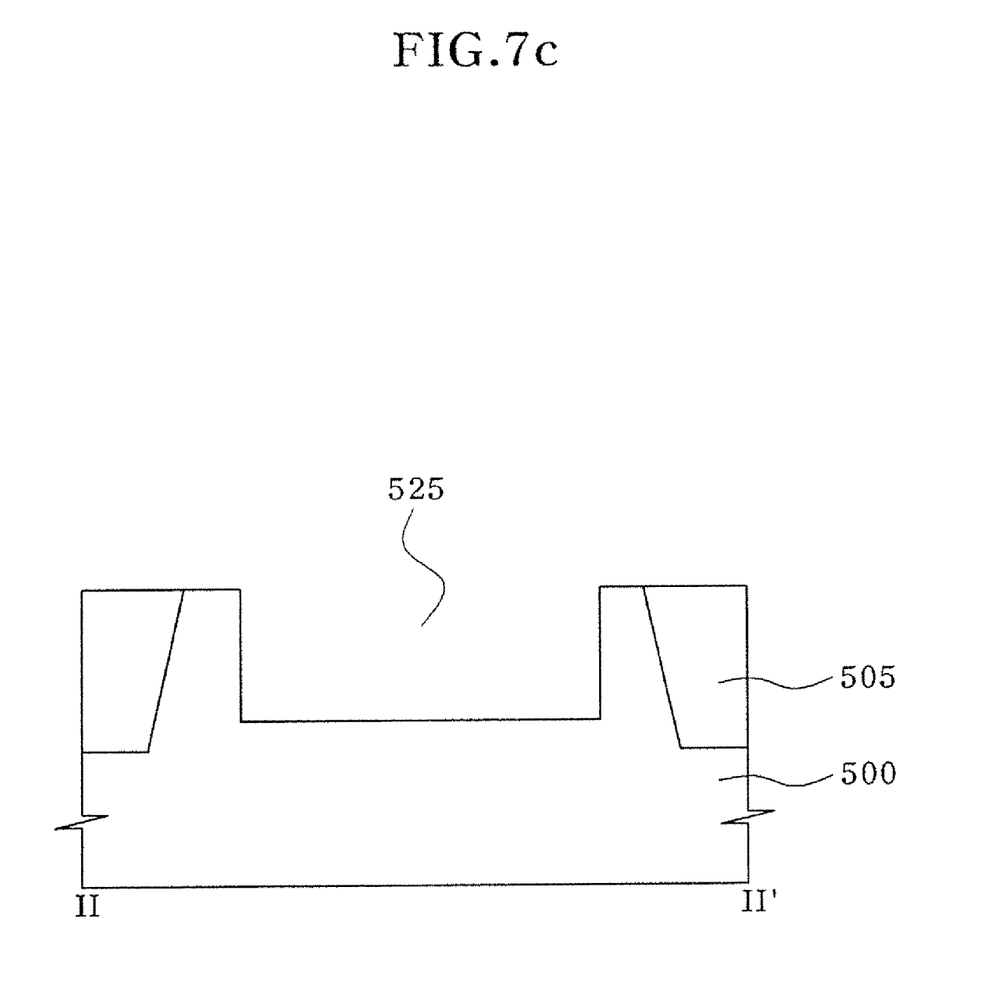

Referring to FIG. 7A to 7C, the region of the semiconductor substrate 500 exposed by the opening 520 is etched using the photoresist layer pattern 515 as a mask to form the recess trench 525 to a predetermined depth in the semiconductor substrate 500. The recess trench 525 may be formed in the active region 510 and may be a rectangular type in which a length in the Y-axis direction is greater than that in the X-axis direction. In addition, the recess trench 525 may be formed, for example, in an island type so as not to exceed the active region 510. The photoresist layer pattern 515 is then removed. A space, b, is defined between adjacent recess trenches 525. The number and size of the spaces are determined by the profile and width of the entire transistor that is to be formed later.

Referring to FIG. 7B, showing a cross-sectional view taken along line I-I' of FIG. 7A, the effective channel of the transistor is positioned along the recess trench 525 formed in the active region 510. The effective channel length of the transistor increases proportionally to the depth of the recess trench 525 formed in the semiconductor substrate 500.

Figure 8A:
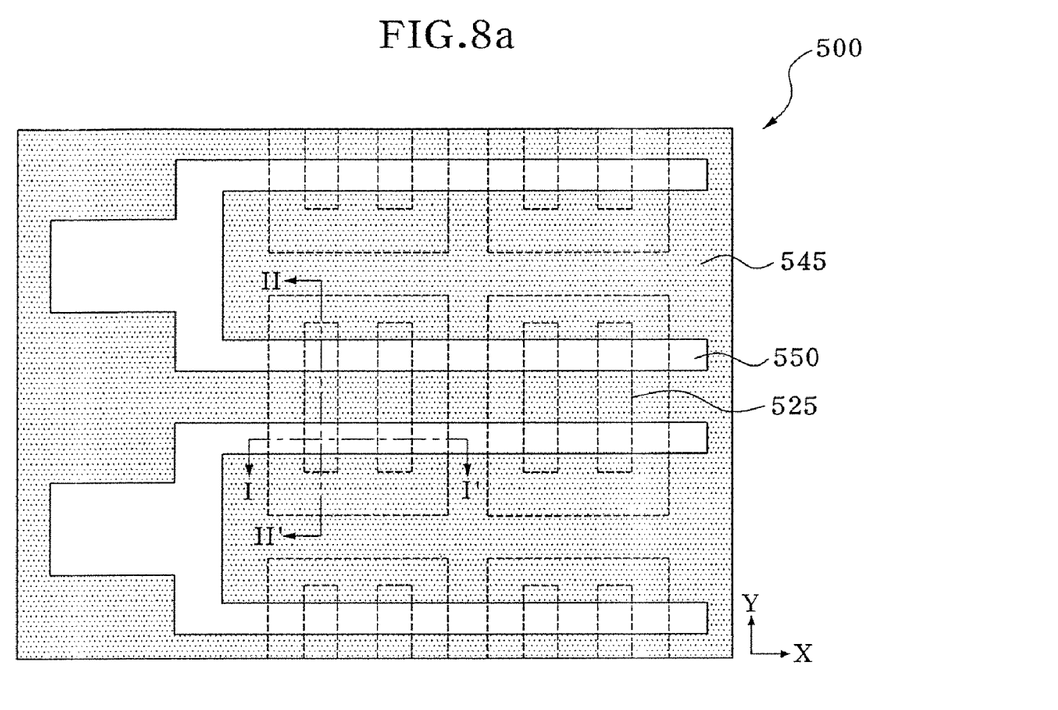
Figure 8B:
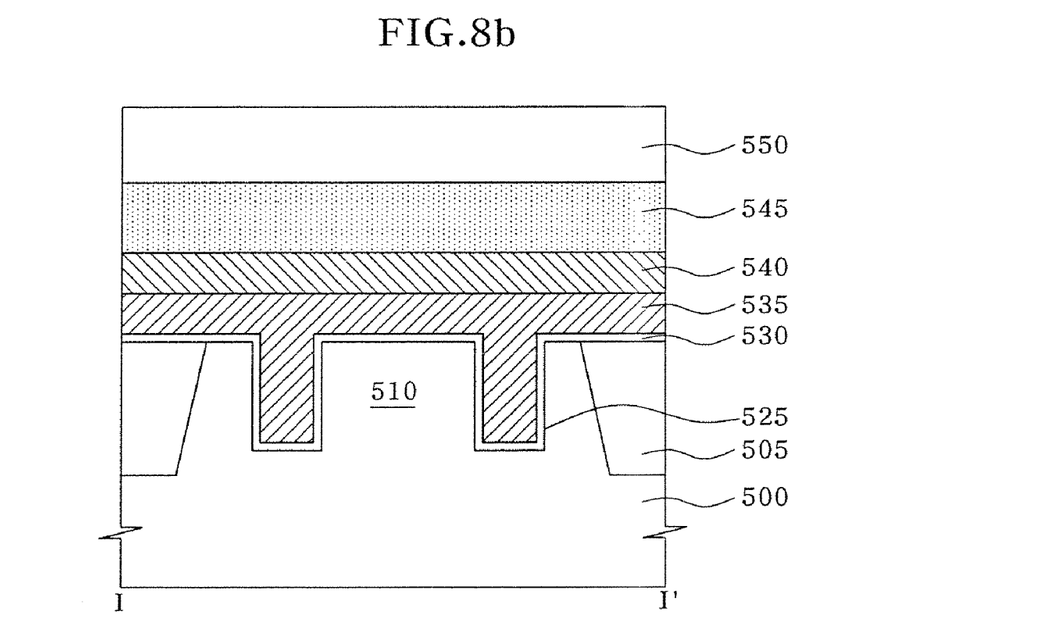
Figure 8C:
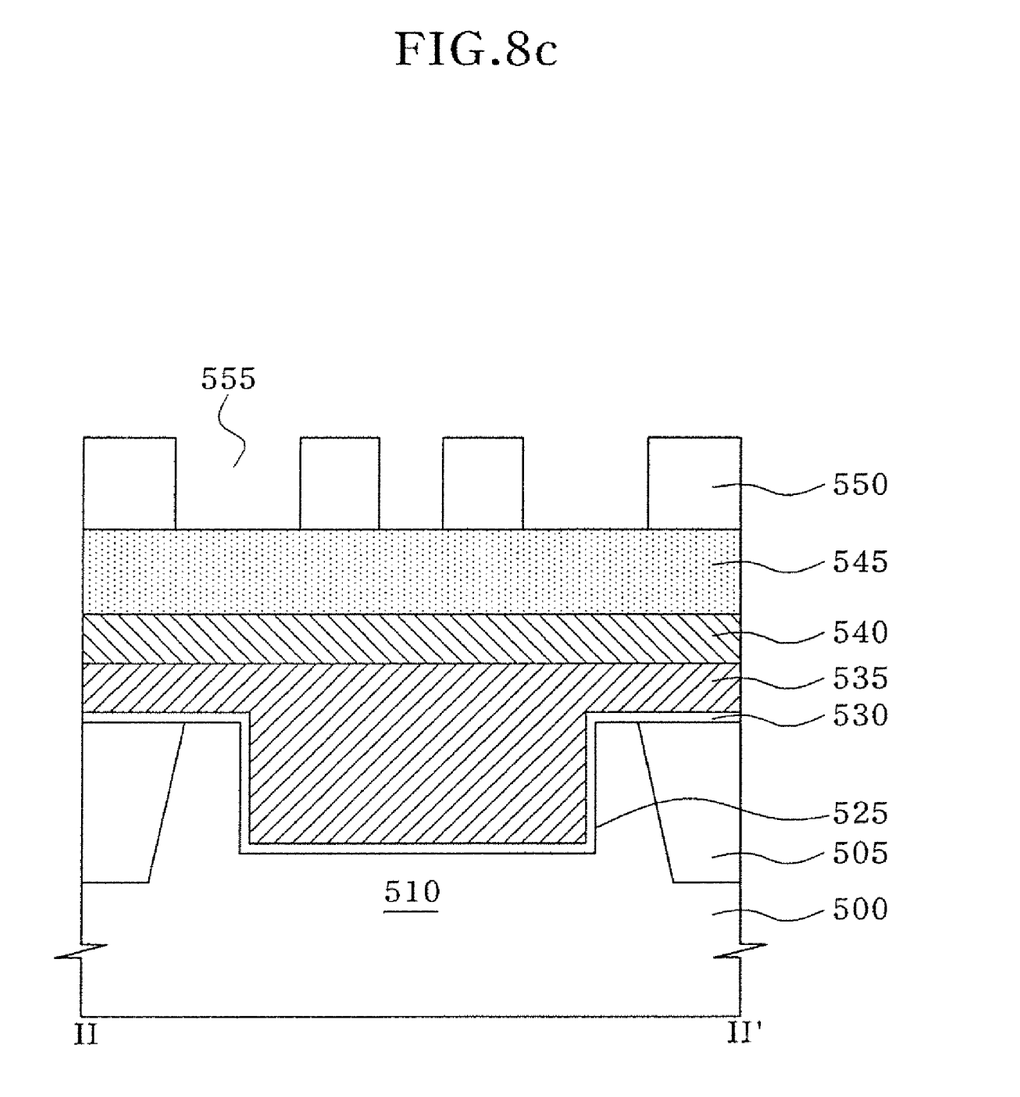

Referring to FIG. 8A to 8C, a gate insulating layer 530, a conductive layer 535, a metal layer 540, and a hard mask layer 545 may be sequentially deposited over the semiconductor substrate 500. The gate insulating layer 530 may be formed of an oxide layer using an oxidation process, and the conductive layer 535 may be formed of a polysilicon layer. The metal layer 540 may be formed of a tungsten (W) layer or a tungsten silicide (WSix) layer, and the hard mask layer 545 may be formed of a nitride layer. A barrier metal layer (not shown) may be deposited after the deposition of the conductive layer 535 but before the deposition of the metal layer 540.

Thereafter, a photoresist layer may be coated on the hard mask layer 545 and patterned to form a photoresist layer pattern 550. A portion of the hard mask layer 545 may be blocked by the photoresist layer pattern 550.

The photoresist layer pattern 550 may be formed in a substantially straight line pattern and disposed to cross the recess trench 525 at approximately right angles.

Referring to FIG. 8B, a cross-sectional view taken along line I-I' of FIG. 8A, layers stacked over the recess trench 525 are blocked by the photoresist layer pattern 550 in the X-axis direction on the semiconductor substrate 500. Referring to FIG. 8C, a cross-sectional view taken along line II-II' of FIG. 8A, an opening 555 of the photoresist layer pattern 550 is formed in the Y-axis direction and exposes a portion of the hard mask layer 545. A gate line may be formed in a region blocked by the photoresist layer pattern 550.

Figure 9A:
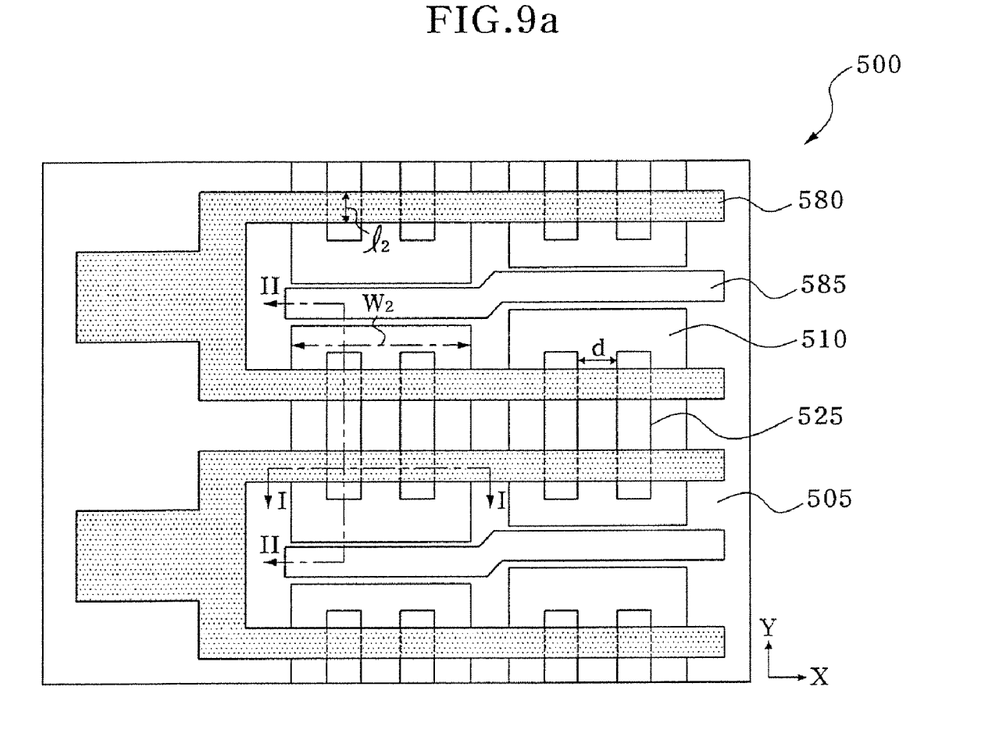
Figure 9B:
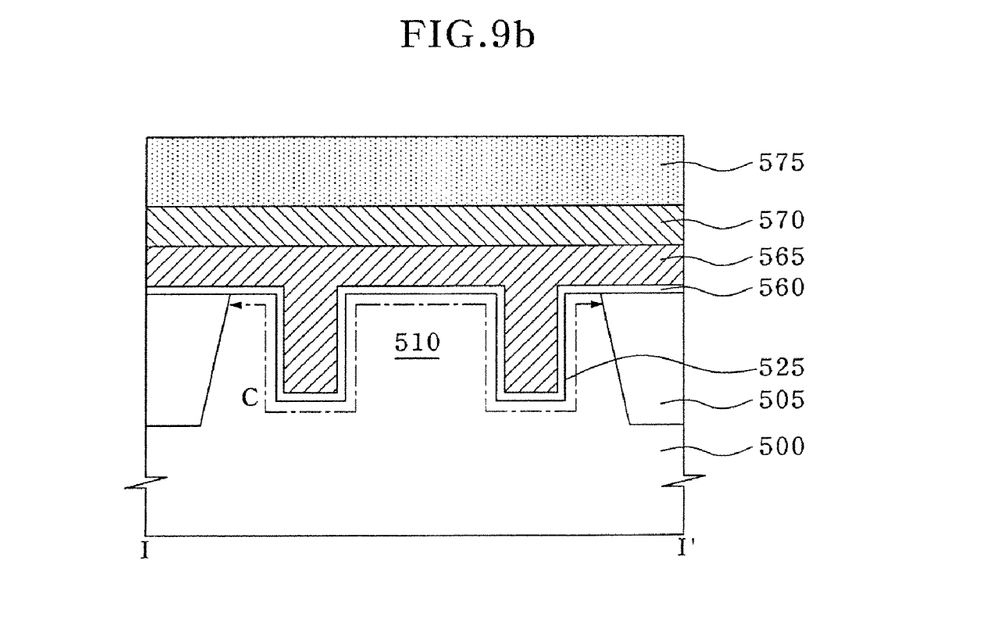
Figure 9C:
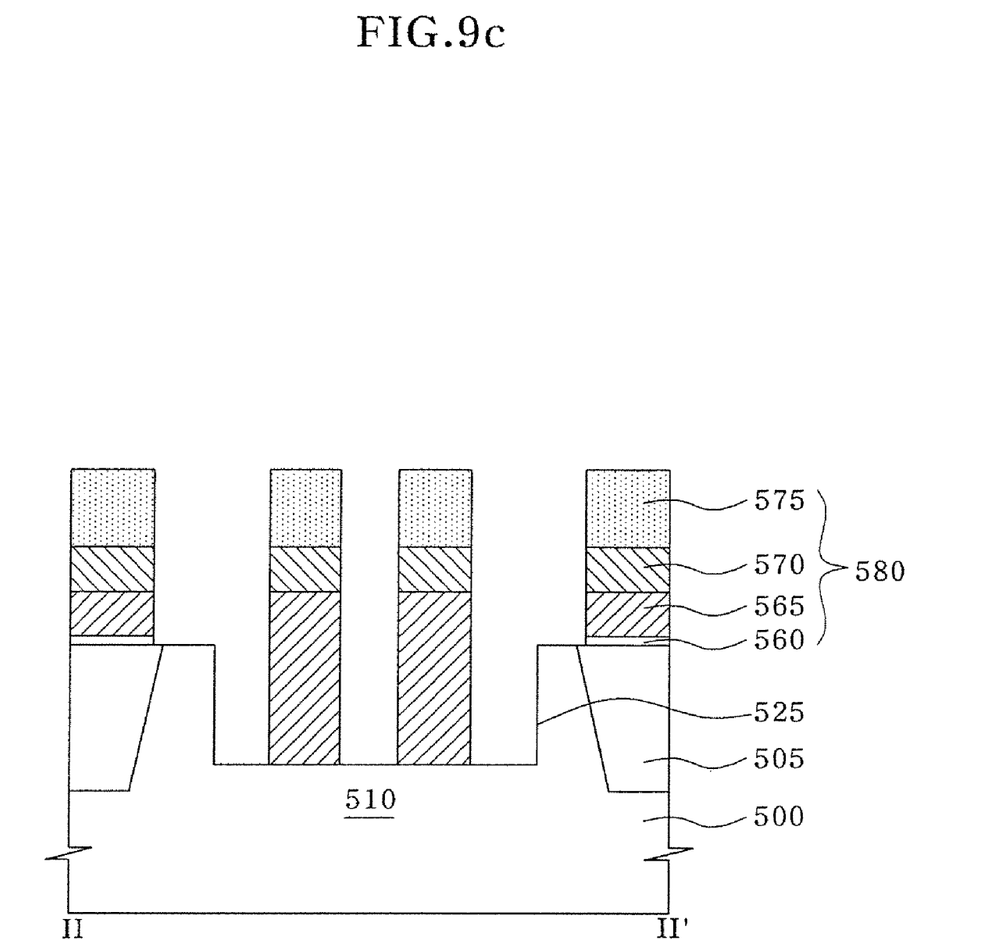

Referring to FIG. 9A to 9C, the hard mask layer through the gate insulating layer are entirely etched using a photoresist layer pattern as a mask to form a gate line 580. The gate line 580 may include a gate insulating layer pattern 560, a conductive layer pattern 565, a metal layer pattern 570, and a hard mask layer pattern 575, which may be stacked in sequence. In order to improve the uniformity of the transistor, a gate dummy pattern 585 may be formed while the gate line 580 is being formed on an active region 510. The gate dummy pattern 585 and the gate line 580 may be formed, for example, simultaneously.

Referring to 9B, showing a cross-sectional view taken along line I-I' of FIG. 9A, the gate line 580 is formed in a substantially straight line pattern and disposed to cross a recess trench 525 at approximately right angles. The effective channel C of the gate line 580 is positioned along the recess trenches 525. The length of the effective channel C is longer than that of a flat panel type channel by approximately twice the depth of each recess trench 525.

The width W2 of the gate line 580 increases by approximately twice the depth of each recess trench 525 in the active region 510. Accordingly, a desired effective channel length is ensured. In addition, the length of the effective channel C increases by approximately twice the depth of each recess trench 525, so that the width W2 of the gate line 580 can be shortened by the increased length of the effective channel C. Thus, the size of an entire core region can be reduced. The length l2 of the gate line 580 is not changed since the gate line 580 has a straight line pattern, so that the length of the transistor is not changed. In a light exposing process performed to form a gate line, the OPC process can be effectively performed.

The above method for forming the gate line in a straight line pattern and the recess trench in the active region to ensure the width of the transistor can be used to form, for example, a YI transistor, a latch transistor, a sub word line drive PMOS transistor, a main word line drive transistor, and a Y decoder transistor. Referring to FIGS. 10 and 11, gate lines 610 and 710 are formed along recess trenches 600 and 700 in active regions, respectively. Accordingly, the widths W3 and W4 of transistors increase proportionally to the depths of the recess trenches 600 and 700, thereby increasing effective channel lengths.

The embodiments of the present invention have been disclosed above for illustrative purpose. Those skilled in the art will appreciate that various modifications, additions and substitutions are possible, without departing from the scope and spirit of the invention as disclosed in the accompanying claims.

What is claimed is:

1. A transistor of a semiconductor device, the transistor comprising:
   a semiconductor substrate comprising a plurality of active regions defined by an isolation layer, wherein each of the active regions is completely surrounded by the isolation layer;
   a first recess trench formed in one of the active regions and disposed to cross the semiconductor substrate within the one of the active regions;
   a second recess trench formed in the one of the active regions and disposed parallel to the first recess trench;
   a gate line formed as a substantially straight line pattern, wherein the gate line crosses each of the first recess trench and the second recess trench at a right angle and extends from the first recess trench to the second recess trench while filling the first and second trenches; and
   a gate dummy pattern disposed between the active regions while being spaced apart from the gate line, wherein the gate dummy pattern is formed simultaneously with the gate line.

2. The transistor of claim 1, wherein the gate dummy pattern is formed of a material similar to a material transistor of the gate line.

3. The transistor of claim 1, wherein the first recess trench and the second recess trench are formed in a rectangular type in which a length in a Y-axis direction is greater than a length in an X-axis direction.

4. The transistor of claim 1, wherein the transistor is selected from the group consisting of a latch transistor, a sub word line drive PMOS transistor, a main word line drive transistor, a Y-decoder transistor, and a YI transistor.

5. A transistor of a semiconductor device, the transistor comprising:
   a semiconductor substrate comprising a plurality of active regions defined by an isolation layer, wherein each of active regions is completely surrounded by the isolation layer;
   a first recess trench formed in a first active region of the active regions and disposed to cross the semiconductor substrate within the first active region;
   a second recess trench formed in the first active region and disposed parallel to the first recess trench;
   a first gate line formed as a substantially straight line pattern, wherein the first gate line crosses each of the first recess trench and the second recess trench at a right angle and extends from the first recess trench to the second recess trench while filling the first and second trenches;
   a second gate line formed as a substantially straight line pattern and disposed on a second active region of the active regions, wherein the second gate line is parallel to the first gate line and the second active region is parallel to the first active region; and a gate dummy pattern disposed between the first active region and the second active region while being spaced apart from the first gate line and the second gate line, wherein the gate dummy pattern is formed simultaneously with the first and second gate lines.

6. The transistor of claim 5, wherein the gate dummy pattern is formed of a material similar to a material of the first and second gate lines.

7. The transistor of claim 5, wherein the first recess trench and the second recess trench are formed in a rectangular type in which a length in a Y-axis direction is greater than a length in an X-axis direction.

8. The transistor of claim 5, wherein the transistor is selected from the group consisting of a latch transistor, a sub word line drive PMOS transistor, a main word line drive transistor, a Y-decoder transistor, and a YI transistor.

* * * * *